United States Patent
Sano et al.

(10) Patent No.: US 8,593,201 B2
(45) Date of Patent: Nov. 26, 2013

(54) SIGNAL OUTPUT CIRCUIT

(75) Inventors: Kimikazu Sano, Kanagawa (JP);
Hiroyuki Fukuyama, Kanagawa (JP);
Hideyuki Nosaka, Kanagawa (JP);
Makoto Nakamura, Kanagawa (JP);
Koichi Murata, Kanagawa (JP);
Masatoshi Tobayashi, Kanagawa (JP);
Eisuke Tsuchiya, Kanagawa (JP)

(73) Assignees: Nippon Telegraph and Telephone Corporation, Tokyo (JP); NTT Electronics Corporation, Kanagawa (JP)

( * ) Notice: Subject to any disclaimer, the term of this patent is extended or adjusted under 35 U.S.C. 154(b) by 0 days.

(21) Appl. No.: 13/527,510

(22) Filed: Jun. 19, 2012

(65) Prior Publication Data
US 2012/0319766 A1    Dec. 20, 2012

(30) Foreign Application Priority Data

Jun. 20, 2011  (JP) ................................. 2011-135973

(51) Int. Cl.
*H03L 5/00*         (2006.01)
(52) U.S. Cl.
USPC ............ 327/307; 327/108; 327/109; 327/295
(58) Field of Classification Search
USPC .................................. 327/108, 109, 295, 307
See application file for complete search history.

(56) References Cited

U.S. PATENT DOCUMENTS

| 7,368,968 | B1 * | 5/2008 | Lai et al. | 327/307 |
| 7,477,086 | B1 * | 1/2009 | Maung | 327/333 |
| 7,679,418 | B2 * | 3/2010 | Vlasenko | 327/333 |
| 2008/0018392 | A1 * | 1/2008 | Nolan et al. | 330/9 |
| 2008/0303575 | A1 * | 12/2008 | Ikeda | 327/295 |
| 2009/0261872 | A1 * | 10/2009 | Coyne et al. | 327/144 |
| 2010/0301905 | A1 * | 12/2010 | Kanda | 327/109 |

FOREIGN PATENT DOCUMENTS

| JP | 61-140218 | 6/1986 |
| JP | 02-002207 | 1/1990 |
| JP | 08-265137 | 10/1996 |
| JP | 2007-158084 A | 6/2007 |
| JP | 2008-153544 | 7/2008 |
| WO | WO 03/044550 | 5/2003 |

\* cited by examiner

*Primary Examiner* — John Poos
(74) *Attorney, Agent, or Firm* — Blakely Sokoloff Taylor & Zafman

(57) ABSTRACT

In a signal output circuit, an input buffer externally receives a single-phase switching instruction signal to switch a state of the output circuit a shutdown disable state or a shutdown enable state, and converts and outputs the single-phase switching instruction signal into a differential switching instruction signal. A generation control circuit outputs a generation control signal for controlling generation of a control voltage in the control voltage generation circuit based on the differential switching instruction signal. A control voltage generation circuit outputs the control voltage upon changing a value of the control voltage in accordance with a logic of the single-phase switching instruction signal. An output circuit externally receives a differential input signal, outputs a differential output signal upon impedance-converting the differential input signal, and switches between the shutdown disable state and the shutdown enable state of the differential input signal.

9 Claims, 14 Drawing Sheets

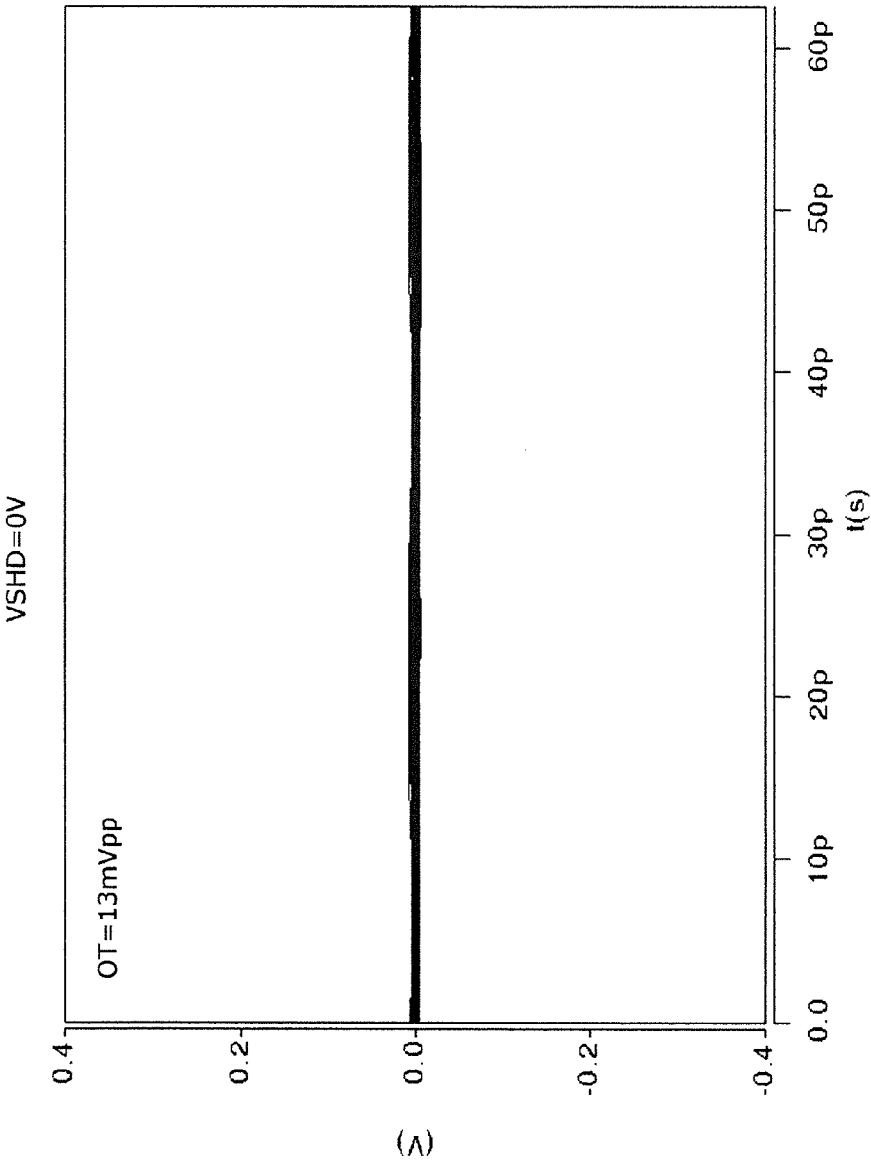

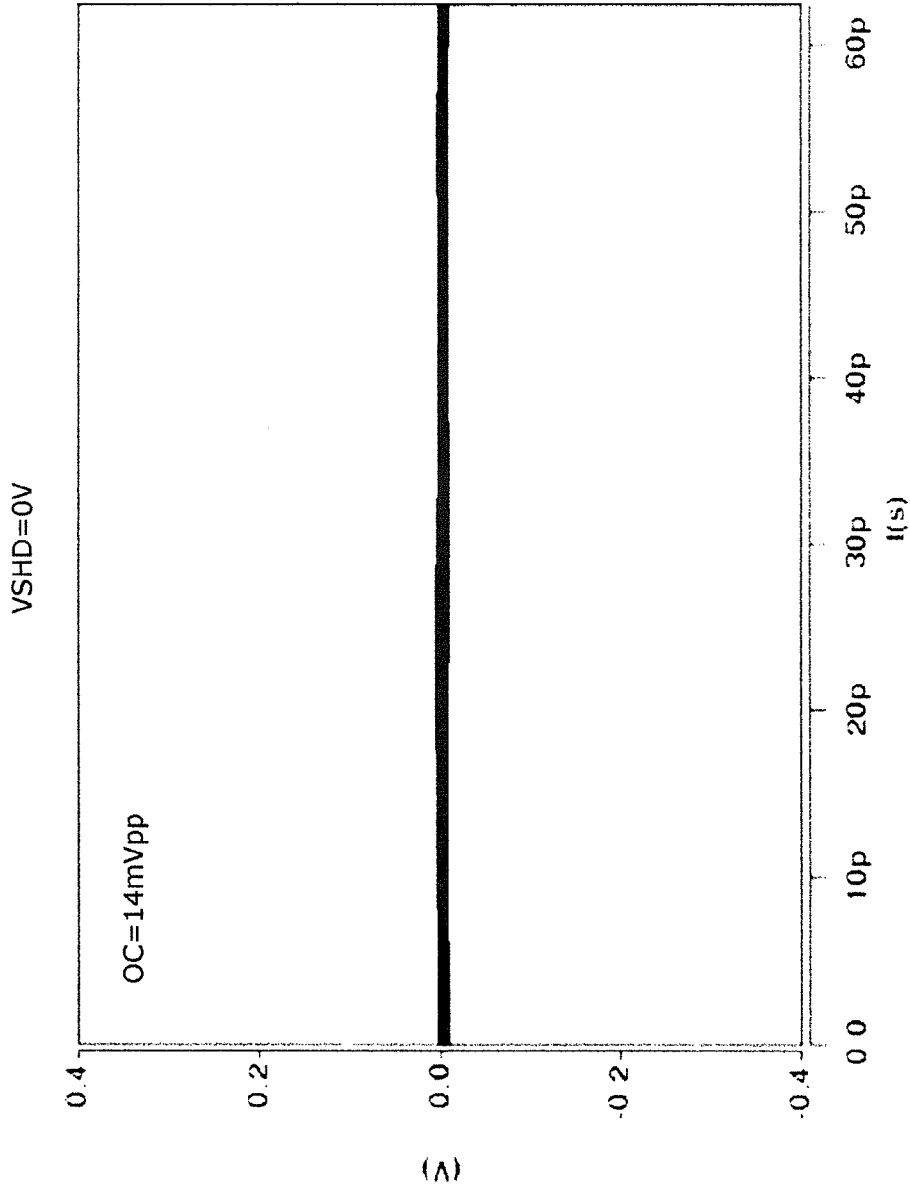

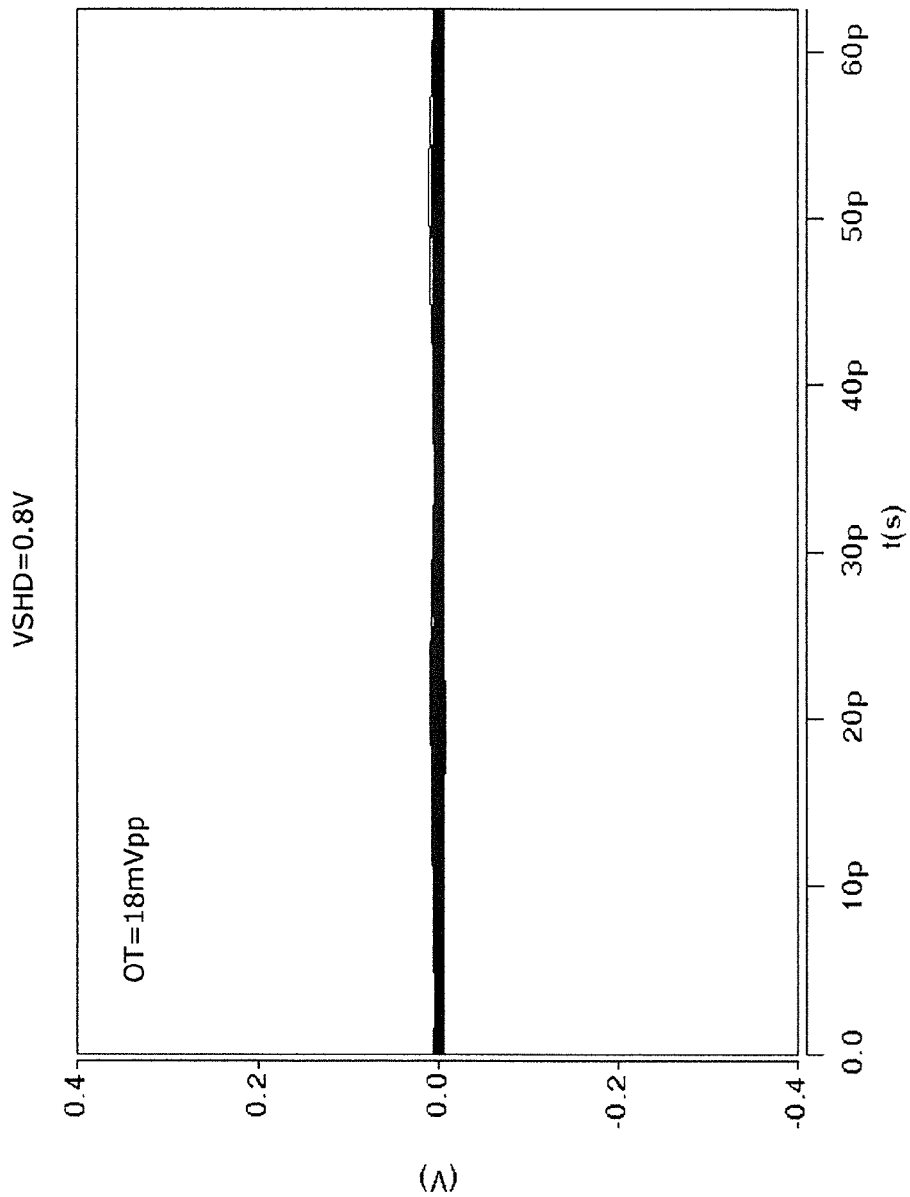

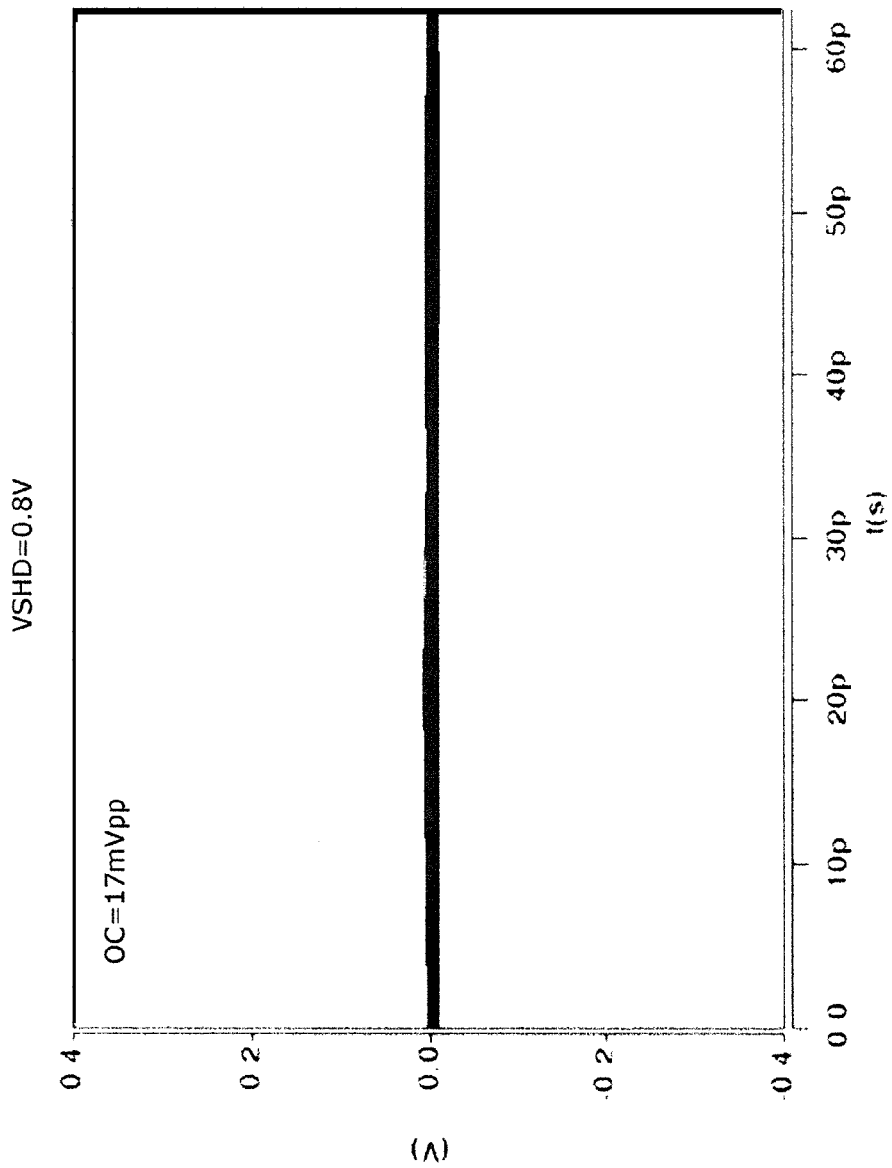

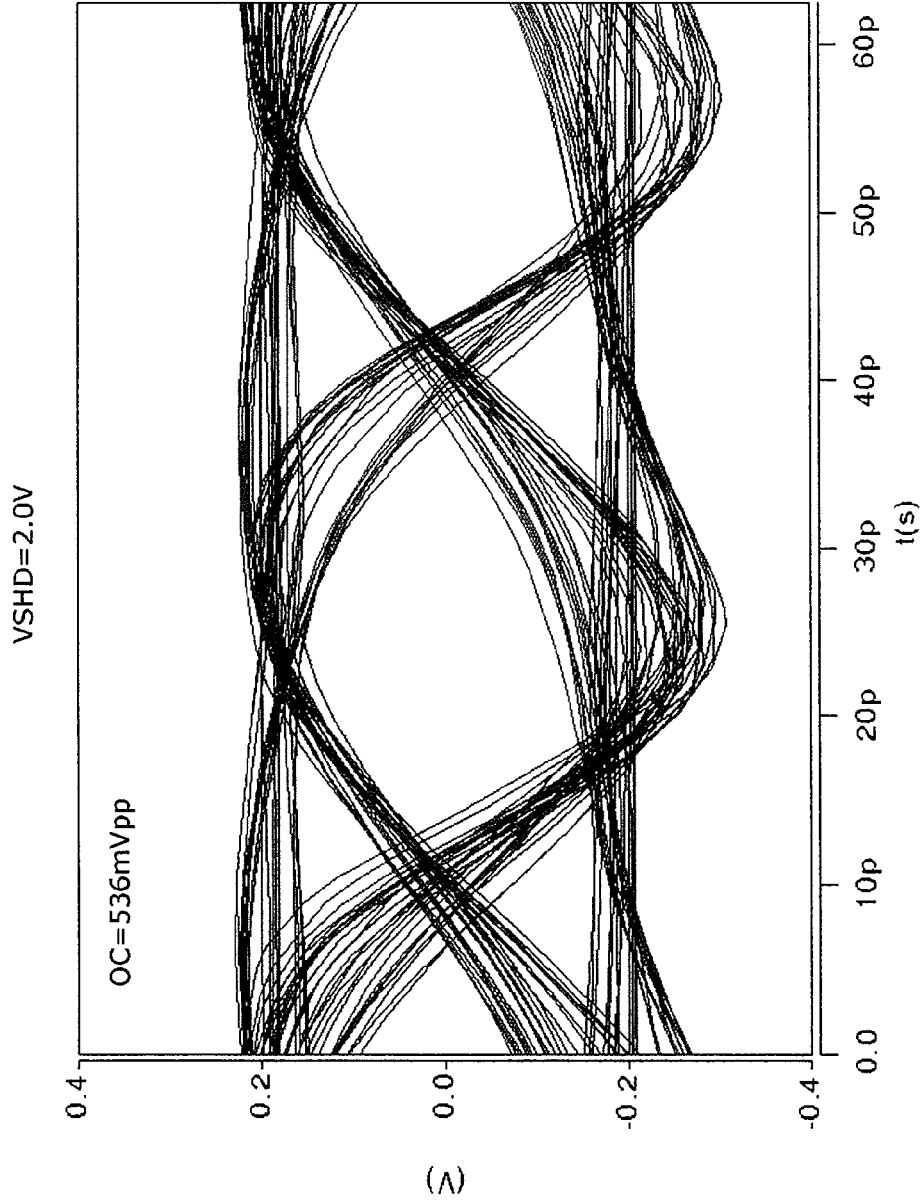

Prior Art

SIGNAL OUTPUT CIRCUIT

BACKGROUND OF THE INVENTION

The present invention relates to a semiconductor integrated circuit and, more particularly, to a signal output circuit having a shutdown function of switching between the shutdown disable state and shutdown enable state of an output signal in accordance with a single-phase digital signal.

A signal output circuit using an impedance conversion circuit such as a transistor differential pair or emitter follower is used as the output stage of a TIA (TransImpedance Amplifier), LA (Limiting Amplifier) which amplifies a light signal, or the like or the driving circuit of an LD (Laser Diode).

In many cases, an impedance conversion circuit such as a transistor differential pair or emitter follower used as such a signal output circuit includes, on the emitter terminal side of an output transistor, a current source transistor which supplies an operating current to the output transistor. For this reason, shutting down the supply of a current to the output transistor by setting the base voltage of the current source transistor to a threshold or less can shut down signal output from the output transistor.

Conventionally, Japanese Patent Laid-Open No. 2007-158084 has disclosed an LD driver circuit using NMOSs as a signal output circuit having a shutdown function of shutting down such signal output. FIG. 8 shows a conventional signal output circuit.

In this signal output circuit, at the shutdown disable time, a transistor differential pair constituted by npn transistors Q1 and Q2 (output transistors) amplify differential signals input to terminals ISN and ISP to a degree sufficient to drive an LD, and the amplified signals are output from terminals OSP and OSN.

An npn transistor Q3 and a resistor RSS are respectively a constant current source transistor and its constant current source stabilizing resistor. These two elements constitute a current source for supplying operating currents for performing shutdown disable operation with respect to the differential pair Q1 and Q2.

In addition, an N-type MOS transistor MN1 connected between the base terminal of the transistor Q3 and a terminal VCS and an N-type MOS transistor MN2 connected between the base terminal of the transistor Q3 and a power supply potential VEE are switches which selectively switch one of VCS and VEE as a voltage to be applied to the base terminal of the transistor Q3.

At the shutdown disable time, differential signals ISHN and ISHP input to the gate terminals of the MOS transistors MN2 and MN1 are respectively set at low level and high level to turn off the MOS transistor MN2 and turn on the MOS transistor MN1. With this operation, the voltage VCS is applied to the base terminal of the transistor Q3 to supply operating currents for performing shutdown disable operation from the transistor Q3 to the differential pair Q1 and Q2. As a result, the differential input signals input to the terminals ISN and ISP are output from terminals OSP and OSN via the differential pair Q1 and Q2.

In contrast, at the shutdown enable time, the differential signals ISHN and ISHP are respectively set at high level and low level to turn on the MOS transistor MN2 and turn off the MOS transistor MN1. With this operation, since the power supply potential VEE is applied to the base terminal of the transistor Q3, no operating currents are supplied from the transistor Q3 to the differential pair Q1 and Q2. As a result, the differential input signals input to the terminals ISN and ISP are not output from the differential pair Q1 and Q2, thereby setting a shutdown enable state.

According to this conventional technique, it is necessary to use NMOS transistors for switching between the shutdown disable state and shutdown enable state in addition to npn transistors. For this reason, manufacturing requires not only a manufacturing process for npn transistors, e.g., a general InP HET process, but also a manufacturing process for NMOS transistors. This complicates the manufacturing process and makes impossible to form a signal output circuit using a compound semiconductor substrate on which npn transistors and NMOS transistors are difficult to form together.

In addition, the above conventional technique requires the differential signals ISHN and ISPN as digital signals for externally switching between the shutdown disable state and shutdown enable state, and cannot switch between the shutdown disable state and shutdown enable state by using single-phase digital signals. For this reason, this technique cannot be directly applied to any circuit to which single-phase digital signals are output as signals for switching between the shutdown disable state and shutdown enable state. This limits the application range of a signal output circuit itself.

SUMMARY OF THE INVENTION

The present invention has been made to solve the above problems, and has as its object to provide a signal output circuit which can increase the degree of freedom of compound semiconductor process types that can be used by using only an npn transistor manufacturing process, and can externally control switching between the shutdown disable state and shutdown enable state using single-phase digital signals.

According to the present invention, there is provided a signal output circuit comprising an input buffer, a generation control circuit, a control voltage generation circuit, and an output circuit, each using npn transistors, wherein the input buffer externally receives a single-phase switching instruction signal for instructing to switch a state of the output circuit to one of a shutdown disable state and a shutdown enable state, and converts and outputs the single-phase switching instruction signal into a differential switching instruction signal formed from two signals having phases opposite to each other, the generation control circuit outputs a generation control signal for controlling generation of a control voltage in the control voltage generation circuit based on the differential switching instruction signal, the control voltage generation circuit outputs the control voltage upon changing a value of the control voltage in accordance with a logic of the single-phase switching instruction signal based on the generation control signal, and the output circuit externally receives a differential input signal, outputs a differential output signal upon impedance-converting the differential input signal, and switches between the shutdown disable state and the shutdown enable state of the differential input signal based on the control voltage.

BRIEF DESCRIPTION OF HE DRAWINGS

FIGS. 6A to 6D are simulation waveform charts of differential output signals in a shutdown enable state;

FIGS. 7A to 7D are simulation waveform charts of differential output signals in a shutdown disable state.

DESCRIPTION OF THE PREFERRED EMBODIMENTS

The embodiments of the present invention will be described next with reference to the accompanying drawings.

[First Embodiment]

Figure 1:
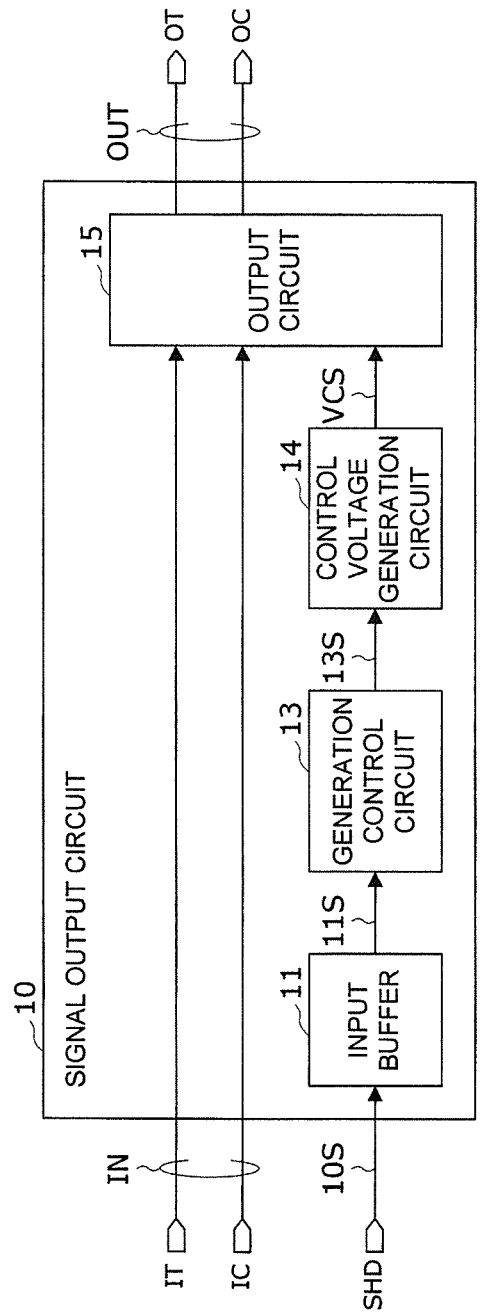
FIG. 1 is a block diagram showing the arrangement of a signal output circuit according to the first embodiment of the present invention.

A signal output circuit according to the first embodiment of the present invention will be described first with reference to FIG. 1. FIG. 1 is a block diagram showing the arrangement of the signal output circuit according to the first embodiment.

A signal output circuit 10 is a circuit which impedance-converts differential input signals IN from terminals IT and IC and outputs differential output signals OUT from terminals OT and OC. The signal output circuit 10 is used as an output stage of a TIA (TransImpedance Amplifier), LA (Limiting Amplifier) which amplifies a light signal, or the like or the driving circuit of an LD (Laser Diode).

The signal output circuit 10 includes, as main circuit units, an input buffer 11, a generation control circuit 13, a control voltage generation circuit 14, and an output circuit 15, which operate between a power supply potential VCC on the high-potential side (first power supply potential) and a power supply potential VEE on the low-potential side (VCC>VEE: second power supply potential). The circuits 11 and 13 to 15 use npn transistors.

The input buffer 11 externally receives, via a terminal SHD, a single-phase switching instruction signal 10S for instructing to switch the state of the output circuit 15 between the shutdown disable state and shutdown enable state. The input buffer 11 has a function of converting the single-phase switching instruction signal 10S into a differential switching instruction signal 11S formed from two signal having phases opposite to each other.

The generation control circuit 13 has a function of outputting a generation control signal 13S for controlling the generation of a control voltage VCS in the control voltage generation circuit 14 based on the differential switching instruction signal 11S from the input buffer 11.

The control voltage generation circuit 14 has a function of generating and outputting the control voltage VCS whose voltage value changes in accordance with the logic of the single-phase switching instruction signal 10S based on the generation control signal 13S from the generation control circuit 13. In other words, the control voltage generation circuit 14 has a function of outputting the control voltage VCS upon changing the value of the control voltage VCS in accordance with the logic of the single-phase switching instruction signal 10S based on the generation control signal 13S.

The output circuit 15 has a function of impedance-converting the differential input signals IN externally input via the terminals IT and IC and outputting the differential output signals OUT to the outside via the terminals OT and OC. The output circuit 15 also has a function of switching between the shutdown disable state and shutdown enable state of the differential input signals IN based on the control voltage VCS from the control voltage generation circuit 14.

Figure 8:
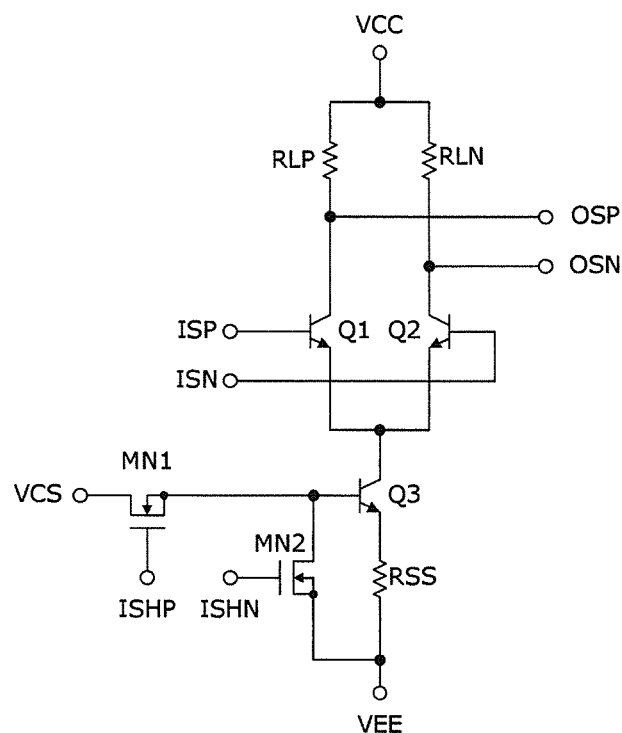
FIG. 8 is a circuit diagram showing a conventional signal output circuit.

As described above, the conventional signal output circuit shown in FIG. 8 is based on a technical idea that switching between the shutdown disable state and shutdown enable state is controlled by selectively applying one of the two voltage values VCS and VEE prepared in advance to the base terminal of the constant current source transistor Q3. Therefore, to selectively apply VCS and VEE to the base terminal of the transistor Q3, the N-type MOS transistors MN1 and MN2 are provided for this circuit to complementarily switch it using the differential signals ISHN and ISHP.

In contrast to this, this embodiment focuses attention on the fact that control on switching between the shutdown disable state and shutdown enable state can be implemented using only npn transistors by outputting a control voltage as a control voltage for controlling the switching operation upon changing its voltage value instead of selectively applying one of two voltage values.

That is, in this embodiment, the output circuit 15 includes an npn output transistor which impedance-converts the differential input signals IN and outputs the resultant signals and an npn current source transistor which supplies an operating current to the output transistor, and the control voltage generation circuit 14 generates the control voltage VCS formed from a voltage value which changes in accordance with the single-phase switching instruction signal 10S, and turns on and off the current source transistor of the output circuit 15 by using the control voltage VCS, thereby switching between the shutdown disable state and shutdown enable state of the differential input signals IN at the output transistors.

Figure 2:
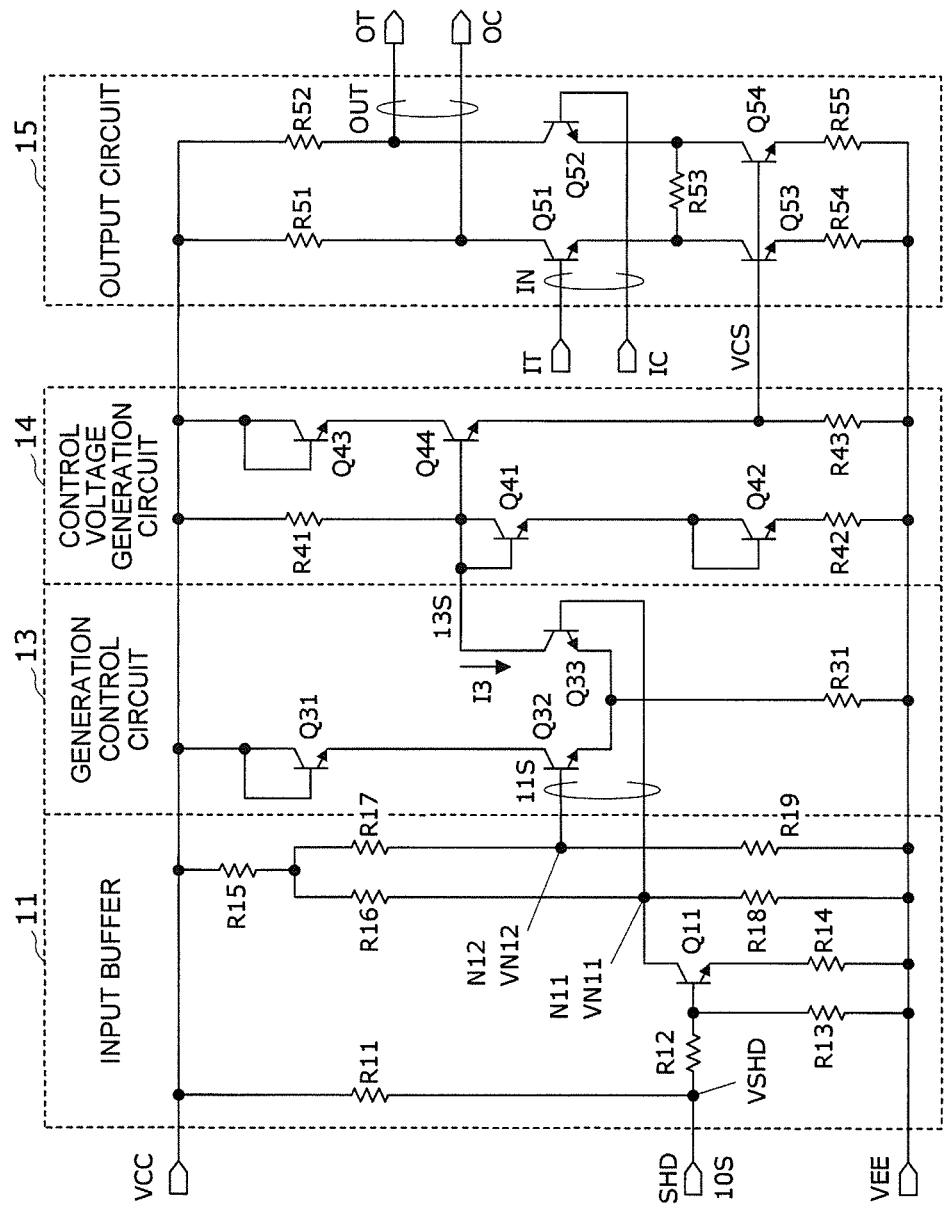
FIG. 2 is a circuit diagram showing an example of the signal output circuit shown in FIG. 1.

FIG. 2 shows an example of the signal output circuit 10 shown in FIG. 1. The signal output circuit 10 in FIG. 2 includes the input and output terminals SHD, IT, IC, OT, OC, VCC, and VEE.

The terminal SHD is an input terminal for the single-phase switching instruction signal 10S for externally instructing to switch the state of the output circuit 15 between the shutdown disable state and shutdown enable state. This embodiment will exemplify a case in which the single-phase switching instruction signal 10S is formed from a single-phase digital signal of LVTTL (Low Voltage TTL) which operates at a low power supply voltage. LVTTL uses a signal within the voltage range of 0 V to +0.8 V as a low-level signal, and uses a signal within the voltage range of +2.0 V to VCC as a high-level signal.

The terminals IT and IC are input terminals for the differential input signals IN input to the output circuit 15. The terminals OT and OC are output terminals for the differential output signals OUT output from the output circuit 15. The terminal VCC is a power supply terminal to which the power supply potential VCC (+3.3 V in this embodiment) is applied. The terminal VEE is a power supply terminal to which the power supply potential VEE (0 V in the embodiment) is applied.

[Input Buffer]

The arrangement and operation of the input buffer 11 will be described with reference to FIG. 2 and Table 1. Table 1 shows signal levels in the shutdown disable state and shutdown enable state of the signal output circuit according to the first embodiment.

TABLE 1

| Signal Output Circuit State | Shutdown Disable State | Shutdown Enable State |
|---|---|---|
| Single-Phase Switching Instruction Signal Voltage VSHD (10S) | high-level (LVTLL) 2 V to VCC | low-level (LVTLL) 0 V to 0.8 V |
| Differential Switching Instruction Signal Voltages VN11 and VN12 (11S) | VN11 < VN12 | VN11 > VN12 |
| Generation Control Signal Current I3 (13S) | 0 | Ion |
| Control Voltage VCS | Vo | 0 (VEE) |

The input buffer 11 includes a resistor R11 (sixth resistor), an npn transistor Q11 (eighth npn transistor), a resistor R13 (ninth resistor), a resistor R16 (11th resistor), a resistor R18 (12th resistor), a resistor R17 (13th resistor), and a resistor R19 (14th resistor). The resistor R11 has one port connected to the terminal SHD (instruction input terminal) to which the single-phase switching instruction signal 10S is input, and the other port connected to the power supply potential VCC. The npn transistor Q11 has a base terminal connected to the terminal SHD via a resistor R12 (seventh resistor), and an emitter terminal connected to the power supply potential VEE via a resistor R14 (eighth resistor). The transistor Q11 outputs, from its collector terminal, a signal, of the differential switching instruction signals 11S, which is opposite in phase to the single-phase switching instruction signal 10S. The resistor R13 has one port connected to the base terminal of the transistor Q11, and the other port connected to the power supply potential VEE. The resistor R16 has one port connected to the collector terminal of the transistor Q11, and the other port connected to the power supply potential VCC via a resistor R15 (10th resistor). The resistor R18 has one port connected to the collector terminal of the transistor Q11, and the other port connected to the power supply potential VEE. The resistor R17 has one port connected to the connection node of the resistors R15 and R16. The resistor R19 has one port connected to the power supply potential VEE, and the other port connected to the other port of the resistor R17. The resistor R19 outputs, from the other port, a signal, of the differential switching instruction signals 11S, which is in phase with the single-phase switching instruction signal 10S.

In this embodiment, the resistance values of the resistors R11, R12, and R13 are determined such that while the terminal SHD is in the open state, a voltage VSHD at the terminal SHD is controlled to the same potential as that set when the high-level (2.0 V to VCC) single-phase switching instruction signal 10S is input to the resistors R11, R12, and R13. In addition, the three resistors R11, R12, and R13 are connected in series between the terminal VCC and the terminal VEE. The terminal SHD is connected to the connection node of the resistors R11 and R12. The base terminal of the transistor Q11 is connected to the connection node of the resistors R12 and R13.

With this arrangement, a voltage lower than the voltage VSHD applied to the terminal SHD is applied to the base terminal of the transistor Q11 to prevent the transistor Q11 from being set in an excessively saturated state, that is, to prevent the base voltage from becoming excessively higher than the collector voltage. In an excessively saturated state, the base terminal is electrically connected to the collector terminal. As a consequence, the amount of current flowing in the terminal SHD via the base terminal increases. The circuit arrangement according to this embodiment can void such a state.

When the low-level single-phase switching instruction signal 10S is input to the terminal SHD, i.e., VSHD is in the voltage range of 0 V to +0.8 V, the amount of current flowing from the collector terminal of the transistor Q11 to the emitter terminal is small. In this case, if the amount of collector current in the transistor Q11 is small, output voltages from the input buffer 11, i.e., an opposite-phase voltage VN11 at a connection node N11 of the resistors R16 and R18 and an in-phase voltage VN12 at a connection node N12 of the resistors R17 and R19, are almost determined by the resistance values of the resistors R16, R17, R18, and R19. In this embodiment, VN11 is set to be higher than VN12. As a result, when the low-level single-phase switching instruction signal 10S is input to the terminal SHD, the differential switching instruction signals 11S output from the input buffer 11 exhibit the relationship of opposite-phase voltage VN11>in-phase voltage VN12.

When the high-level single-phase switching instruction signal 10S is input to the terminal SHD, that is, VSHD is in the voltage range of 2.0 V to VCC, the amount of current flowing from the collector terminal of the transistor Q11 to the emitter terminal increases. This decreases the opposite-phase voltage VN11 at the connection node N11 to a voltage lower than the in-phase voltage VN12 at the connection node N12. As a result, when the high-level single-phase switching instruction signal 10S is input to the terminal SHD, the differential switching instruction signals 11S output from the input buffer 11 exhibit the relationship between opposite-phase voltage VN11<in-phase voltage VN12.

Note that indispensable elements of the input buffer 11 in terms of circuit arrangement are the resistor R13, the transistor Q11, and the resistors R16, R17, R18, and R19.

[Generation Control Circuit]

The arrangement and operation of the generation control circuit 13 will be described next with reference to FIG. 2 and Table 1.

The generation control circuit 13 includes an npn transistor Q31 (first npn transistor), an npn transistor Q32 (second npn transistor), and an npn transistor Q33 (third npn transistor). The transistor Q31 has collector and base terminals connected to the power supply potential VCC. The transistor Q32 has a base terminal receiving a signal, of the differential switching instruction signals 11S, which is in phase with the single-phase switching instruction signal 10S, a collector terminal connected to the emitter terminal of the transistor Q31, and an emitter terminal connected to the power supply potential VEE via a resistor R31 (first resistor). The transistor Q33 has a base terminal receiving a signal, of the differential switching instruction signals 11S, which is opposite in phase to the single-phase switching instruction signal 10S, and an emitter terminal connected to the emitter terminal of the transistor Q32. The transistor Q33 outputs the generation control signal 13S from the collector terminal.

In this embodiment, the generation control circuit 13 is an emitter-coupled differential amplifier constituted by the transistor differential pair Q32 and Q33 as a whole. The generation control circuit 13 outputs, to the control voltage generation circuit 14, the generation control signal 13S as a change in a current value I3 in the direction from the collector terminal of the transistor Q33 to the emitter terminal.

The generation control circuit 13 digitally changes the current value I3 in accordance with the opposite-phase voltage VN11 and in-phase voltage VN12 of the differential switching instruction signals 11S output from the input buffer 11. More specifically, as indicated by Table 1 described above, when opposite-phase voltage VN11>in-phase voltage VN12, that is, the low-level single-phase switching instruction signal 10S is input, the current value I3 becomes a value Ion (Ion>0) determined by the current source resistor R31. In contrast, when opposite-phase voltage VN11<in-phase voltage VN12, that is, the high-level single-phase switching instruction signal 10S is input, the current value I3 becomes almost 0.

Note that indispensable elements of the generation control circuit 13 in terms of circuit arrangement are the transistors Q32 and Q33 and the resistor R31. The resistor R31 may be a current source.

[Control Voltage Generation Circuit]

The arrangement and operation of the control voltage generation circuit 14 will be described next with reference to FIG. 2 and Table 1.

The control voltage generation circuit 14 includes an npn transistor Q41 (fourth npn transistor), an npn transistor Q42 (fifth npn transistor), an npn transistor Q43 (sixth npn transistor), and an npn transistor Q44 (seventh npn transistor). The transistor Q41 has base and collector terminals receiving the generation control signal 13S, and which are connected to the power supply potential VCC via a resistor R41 (second resistor or internal resistor). The transistor Q42 has base and collector terminals connected to the emitter terminal of the transistor Q41, and an emitter terminal connected to the power supply potential VEE via a resistor R42 (third resistor). The transistor Q43 has bas and collector terminals connected to the power supply potential VCC. The transistor Q44 has a base terminal receiving the generation control signal 13S, a collector terminal connected to the emitter terminal of the transistor Q43, and an emitter terminal connected to the power supply potential VEE via a resistor R43 (fourth resistor). The transistor Q44 outputs the control voltage VCS from the emitter terminal.

Of these components, the transistors Q41 and Q42 and the resistors R41 and R42 constitute a constant voltage generation circuit, and the transistors Q43 and Q44 and the resistor R43 constitute an emitter follower.

The control voltage generation circuit 14 digitally changes the voltage value of the control voltage VCS in accordance with the output current I3 of the generation control signal 13S output from the generation control circuit 13. When I3=Ion, the potential at the base terminal of the transistor Q44 decreases by R41×Ion as compared with when I3=0. This embodiment is designed such that when the potential at the base terminal of the transistor Q44 decreases by R41×Ion in accordance with I3=Ion, the control voltage VCS is set to a level close to the voltage VEE (0 V). According to this design, when I3=Ion, that is, the low-level single-phase switching instruction signal 10S is input, the control voltage VCS is set to a value close to 0 V.

In contrast, when I3=0, no current flows into the generation control circuit 13, and hence the control voltage generation circuit 14 outputs, as the control voltage VCS, a voltage Vo (Vo>0) determined by the constant voltage generation circuit constituted by the transistors Q41 and Q42 and the resistors R41 and R42 and the emitter follower constituted by the transistors Q43 and Q44 and the resistor R43. Accordingly, when I3=0, that is, the high-level single-phase switching instruction signal 10S is input, the control voltage VCS is set to the voltage Vo.

That is, the control voltage generation circuit 14 has a function of changing the value of the control voltage VCS in accordance with the voltage generated across the resistor R41 (internal resistor) (the voltage generated at the resistor R41). The generation control circuit 13 has a function of changing the voltage generated at the resistor R41 by extracting the current I3 from the control voltage generation circuit 14 via the resistor R41 and changing a current flowing in the resistor R41 based on the differential switching instruction signal 11S.

[Output Circuit]

The arrangement and operation of the output circuit 15 will be described next with reference to FIG. 2 and Table 1.

The output circuit 15 is basically formed from an emitter-coupled differential amplifier. The output circuit 15 includes an npn transistor Q51 (ninth npn transistor), an npn transistor Q52 (10th npn transistor), a resistor R53 (17th resistor), an npn transistor Q53 (11th npn transistor), and an npn transistor Q54 (12th npn transistor). The transistor Q51 has a base terminal receiving a positive-phase input signal (first phase input signal) of the differential input signals IN, and a collector terminal connected to the power supply potential VCC via a resistor R51 (15th resistor). The transistor Q51 outputs an opposite-phase output signal (second phase output signal) of the differential output signals OUT from the collector terminal. The transistor Q52 has a base terminal receiving an opposite-phase input signal (second phase input signal) of the differential input signals IN, and a collector terminal connected to the power supply potential VCC via a resistor R52 (16th resistor). The transistor Q52 outputs a positive-phase output signal (first phase output signal) of the differential output signals OUT from the collector terminal. The resistor R53 has one port connected to the emitter terminal of the transistor Q51, and the other port connected to the emitter terminal of the transistor Q52. The transistor Q53 has a base terminal receiving the control voltage VCS, a collector terminal connected to the emitter terminal of the transistor Q51, and an emitter terminal connected to the power supply potential VEE via a resistor R54 (18th resistor). The transistor Q54 has a base terminal receiving the control voltage VCS, a collector terminal connected to the emitter terminal of the transistor Q52, and an emitter terminal connected to the power supply potential VEE via a resistor R55 (19th resistor). Note that the terminal IT (first differential input terminal) to which a positive-phase input signal is externally input is connected to the base terminal of the transistor Q51, and a positive-phase input signal is input to the base terminal of the transistor Q51 via the terminal IT. The terminal IC (second differential input terminal) to which an opposite-phase input signal is externally input is connected to the base terminal of the transistor Q52, and a positive-phase input signal is input to the base terminal of the transistor Q52 via the terminal IC.

The output circuit 15 digitally switches its state between the shutdown disable state and shutdown enable state in accordance with the control voltage VCS from the control voltage generation circuit 14. When VCS=0 V, that is, the low-level single-phase switching instruction signal 10S is input, the base-emitter voltage of the transistors Q53 and Q54 as the current source transistors of a differential amplifier becomes almost 0 V. For this reason, no collector current flows in the transistors Q53 and Q54, and no collector current flows in the transistors Q51 and Q52 as output transistors constituting an emitter-coupled pair. As a result, the transistors Q51 and Q52 do not perform shutdown disable operation and shuts down the differential input signals IN.

When VCS=Vo, that is, the high-level single-phase switching instruction signal 10S is input, the transistors Q53 and Q54 supply sufficient currents for making the transistors Q51 and Q52 perform shutdown disable operation. This makes the transistors Q51 and Q52 perform shutdown disable operation with respect to the differential input signals IN, which are then output as the differential output signals OUT from the output terminals OT and OC.

[Operation of First Embodiment]

The operation of the signal output circuit 10 according to this embodiment will be described with reference to Table 1.

The signal output circuit 10 according to this embodiment operates in the following manner as a whole owing to the operation of each circuit unit described above.

That is, when the single-phase switching instruction signal 10S input to the terminal SHD is at high level, the differential switching instruction signals 11S output from the input buffer 11 exhibit the relationship of opposite-phase voltage VN11<in-phase voltage VN12. For this reason, the output current I3 of the generation control signal 13S output from the generation control circuit 13 becomes 0. This sets the control voltage VCS output from the control voltage generation circuit 14 to voltage Vo (Vo>0) in accordance with the logic (shutdown disable) of the single-phase switching instruction signal 10S. As a consequence, the output circuit 15 is set in the shutdown disable state to perform shutdown disable operation with respect to the differential input signals IN input to the terminals IT and IC, thereby outputting the signals as the differential output signals OUT via the terminals OT and OC.

When the single-phase switching instruction signal 10S input to the terminal SHD is at low level, the differential switching instruction signals 11S output from the input buffer 11 exhibit the relationship of opposite-phase voltage VN11>in-phase voltage VN12. For this reason, the output current I3 of the generation control signal 13S output from the generation control circuit 13 becomes Ion (Ion>0). This sets the control voltage VCS output from the control voltage generation circuit 14 to a voltage value close to 0 V (VEE) in accordance with the logic (shutdown enable) of the single-phase switching instruction signal 10S. As a consequence, the output circuit 15 is set in the shutdown enable state, and the differential input signals IN input to the terminals IT and IC are not output from the terminals OT and OC.

As described above, this embodiment is designed such that when no signal is input to the terminal SHD, that is, the terminal SHD is in the open state, a high-level LVTTL digital signal is applied to the terminal SHD. This sets the output circuit 15 in the shutdown disable state. As a result, the differential input signals IN input to the terminals IT and IC undergo shutdown disable operation as the differential output signals OUT via the terminals OT and OC.

[Effects of First Embodiment]

As described above, this embodiment implements the input buffer 11, the generation control circuit 13, the control voltage generation circuit 14, and the output circuit 15 by using npn transistors. The input buffer 11 converts the single-phase switching instruction signal 10S for instructing to switch the state of the output circuit 15 between the shutdown disable state and shutdown enable state into the differential switching instruction signals 11S formed from two signals having phases opposite to each other. The generation control circuit 13 outputs the generation control signal 13S for controlling the generation of the control voltage VCS in the control voltage generation circuit 14 based on the differential switching instruction signals 11S. Based on the generation control signal 13S, the control voltage generation circuit 14 generates the control voltage VCS whose voltage value changes in accordance with the logic of the single-phase switching instruction signal 10S. The output circuit 15 impedance-converts the input differential input signals IN and outputs the resultant signals as the differential output signals OUT. At the same time, the output circuit 15 switches between the shutdown disable state and shutdown enable state of the differential input signals IN based on the control voltage VCS as in the prior art.

This makes it possible to change the voltage value of the control voltage VCS itself and output the resultant voltage as a control voltage for switching control between the shutdown disable state and shutdown enable state instead of selecting and outputting one of two voltage values.

This embodiment can therefore manufacture the signal output circuit 10 by using only a manufacturing process for npn transistors such as a general InP HBT process without requiring any manufacturing process for NMOS transistors. This makes it possible to not only simplify a manufacturing process but also implement the signal output circuit 10 by using a compound semiconductor substrate on which npn transistors and NMOS transistors are difficult to mount together.

In addition, there is no need to externally input any differential signals as digital signals for switching between the shutdown disable state and shutdown enable state, and it is possible to switch between the shutdown disable state and shutdown enable state by using single-phase digital signals. It is therefore possible to use a circuit to which single-phase digital signals are output as signals for switching the shutdown disable state and shutdown enable state. This can broaden the application range of the signal output circuit itself.

[Second Embodiment]

Figure 3:
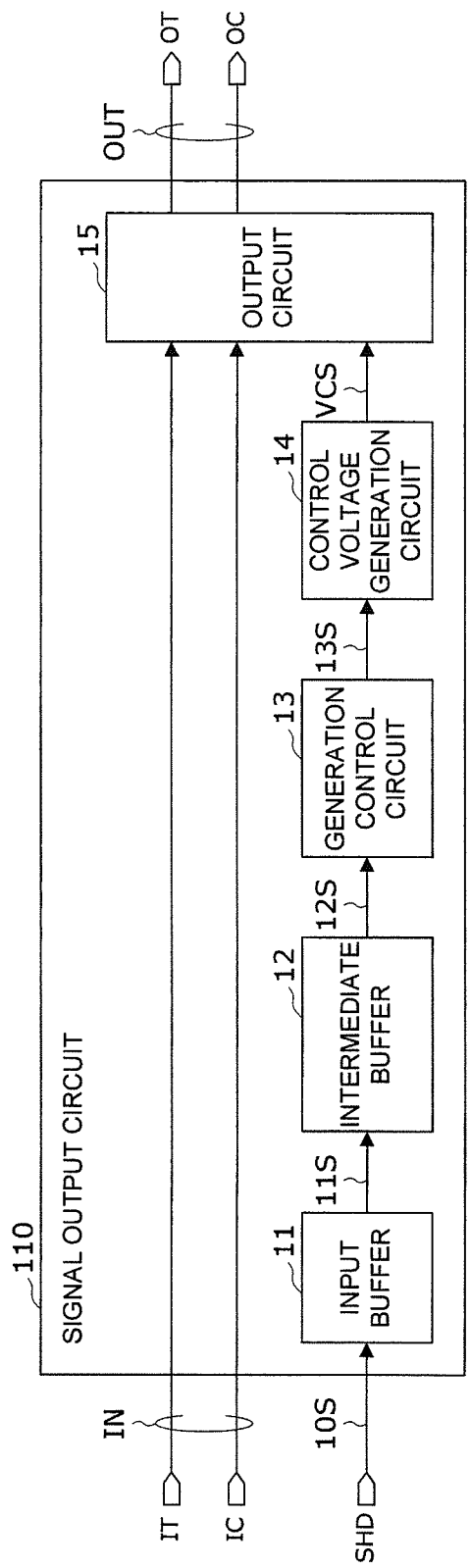
FIG. 3 is a block diagram showing the arrangement of a signal output circuit according to the second embodiment of the present invention.

A signal output circuit according to the second embodiment of the present invention will be described next with reference to FIG. 3. FIG. 3 shows the arrangement of the signal output circuit according to the second embodiment. The first embodiment has exemplified the case in which the generation control circuit 13 outputs the generation control signal 13S based on the differential switching instruction signals 11S from the input buffer 11. The second embodiment will exemplify a case in which an intermediate buffer 12 is inserted between an input buffer 11 and a generation control circuit 13.

In a signal output circuit 110 shown in FIG. 3, the intermediate buffer 12 has a function of impedance-converting a differential switching instruction signal 11S from the input buffer 11 and outputting the resultant signal as an intermediate differential switching instruction signal 12S to the generation control circuit 13.

The generation control circuit 13 has a function of outputting a generation control signal 13S for controlling the generation of a control voltage VCS in a control voltage generation circuit 14 based on the intermediate differential switching instruction signal (impedance-converted differential switching instruction signal) 12S from the intermediate buffer 12.

Arrangements other than these arrangements in this embodiment are the same as those in the first embodiment, and hence a detailed description of them will be omitted.

[Intermediate Buffer]

Figure 4:
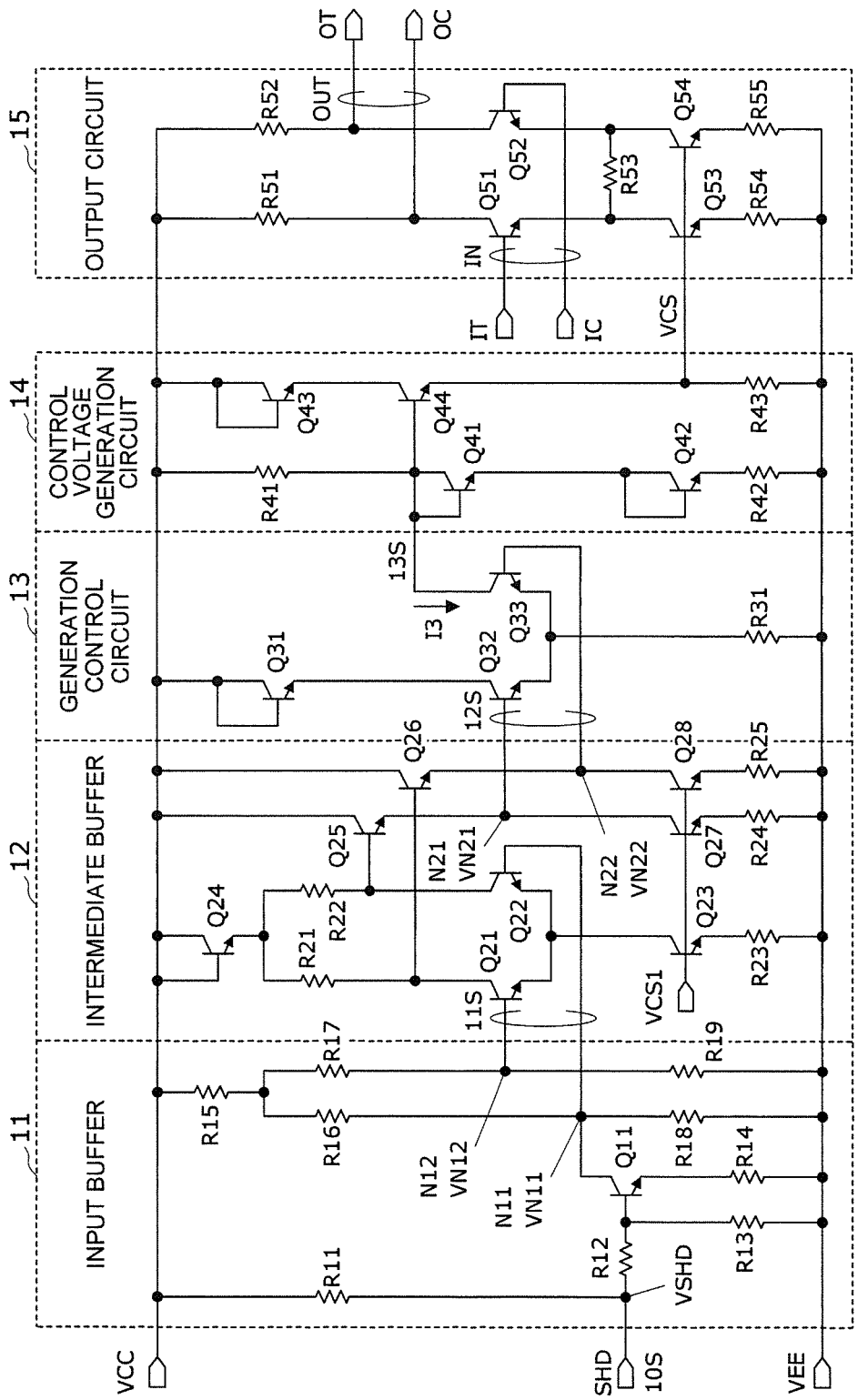
FIG. 4 is a circuit diagram showing an example of the signal output circuit shown in FIG. 3.

The arrangement and operation of the intermediate buffer 12 according to this embodiment will be described with reference to FIG. 4 and Table 2. FIG. 4 shows an example of a signal output circuit 110 shown in FIG. 3. Table 2 shows signal levels in the shutdown disable state and shutdown enable state of the signal output circuit according to the second embodiment.

TABLE 2

| Signal Output Circuit State | Shutdown Disable State | Shutdown Enable State |
|---|---|---|
| Single-Phase Switching Instruction Signal Voltage VSHD (10S) | high-level (LVTLL) 2 V to VCC | low-level (LVTLL) 0 V to 0.8 V |
| Differential Switching Instruction Signal Voltages VN11 and VN12 (11S) | VN11 < VN12 | VN11 > VN12 |
| Intermediate Differential Switching Instruction Signal Voltages VN21 and VN22 (12S) | VN21 > VN22 | VN21 < VN22 |
| Generation Control Signal Current I3 (13S) | 0 | Ion |
| Control Voltage VCS | Vo | 0 (VEE) |

The intermediate buffer 12 includes an npn transistor Q24 (17th npn transistor), an npn transistor Q21 (18th npn transistor), an npn transistor Q22 (19th npn transistor), an npn transistor Q23 (20th npn transistor), an npn transistor Q25 (21st npn transistor), an npn transistor Q26 (22nd npn transistor), an npn transistor Q27 (23rd npn transistor), and an npn transistor Q28 (24th npn transistor). The transistor Q24 has base and collector terminals connected to a power supply potential VCC. The transistor Q21 has a base terminal receiving a signal, of the differential switching instruction signals 11S, which is in phase with a single-phase switching instruction signal 10S, and a collector terminal connected to the emitter terminal of the transistor Q24 via a resistor R21 (24th resistor). The transistor Q22 has a base terminal receiving a signal, of the differential switching instruction signals 11S, which is opposite in phase to the single-phase switching instruction signal 10S, and a collector terminal connected to the emitter terminal of the transistor Q24 via a resistor R22 (25th resistor). The transistor Q23 has a base terminal to which a bias constant voltage VCS1 is applied, a collector terminal connected to the emitter terminals of the transistors Q21 and Q22, and an emitter terminal connected to a power supply potential VEE via a resistor R23 (26th resistor). The transistor Q25 has a base terminal connected to the collector terminal of the transistor Q22, and a collector terminal connected to the power supply potential VCC. The transistor Q25 outputs, from its emitter terminal, a signal, of the intermediate differential switching instruction signals 12S, which is in phase with the single-phase switching instruction signal 10S. The transistor Q26 has a base terminal connected to the collector terminal of the transistor Q21, and a collector terminal connected to the power supply potential VCC. The transistor Q26 outputs, from its emitter terminal, a signal, of the intermediate differential switching instruction signals 12S, which is opposite in phase to the single-phase switching instruction signal 10S. The transistor Q27 has a base terminal to which a bias constant voltage VCS1 is applied, a collector terminal connected to the emitter terminal of the transistor Q25, and an emitter terminal connected to the power supply potential VEE via a resistor R24 (27th resistor). The transistor Q28 has a base terminal to which the bias constant voltage VCS1 is applied, a collector terminal connected to the emitter terminal of the transistor Q26, and an emitter terminal connected to the power supply potential VEE via a resistor R25 (28th resistor).

In the intermediate buffer 12, the transistors Q21 to Q24 and the resistors R21 to R23 constitute an emitter-coupled differential amplifier. The transistors Q25 to Q28 and the resistors R24 and R25 constitute an emitter follower.

The intermediate buffer 12 digitally operates in accordance with the voltages VN11 and VN12 of the differential switching instruction signals 11S from the input buffer 11 and outputs the intermediate differential switching instruction signals 12S.

First of all, when opposite-phase voltage VN11>in-phase voltage VN12, that is, the low-level single-phase switching instruction signal 10S is input, the relationship between an output voltage from the intermediate buffer 12, that is, an in-phase voltage VN21 at a connection node N21 of the emitter terminal of the transistor Q25 and the collector terminal of the transistor Q27, and an opposite-phase voltage VN22 at a connection node N22 of the emitter terminal of the transistor Q26 and the collector terminal of the transistor Q28 satisfies in-phase voltage VN21 opposite-phase voltage VN22.

When opposite-phase voltage VN11<in-phase voltage VN12, that is, the high-level single-phase switching instruction signal 10S is input, in-phase voltage VN21>opposite-phase voltage VN22.

[Effects of Second Embodiment]

As described above, this embodiment further includes the intermediate buffer 12 which uses npn transistors and impedance-converts the differential switching instruction signal 11S into the intermediate differential switching instruction signal 12S. The embodiment is configured such that the generation control circuit 13 outputs the generation control signal 13S for controlling the generation of the control voltage VCS in the control voltage generation circuit 14 based on the intermediate differential switching instruction signal 12S.

This makes the intermediate buffer 12 output the intermediate differential switching instruction signal 12S, which changes in synchronism with the differential switching instruction signals 11S from the input buffer 11, to the generation control circuit 13 upon converting the signal into a low-impedance signal.

Since the output impedance of the differential switching instruction signal 11S from the input buffer 11 depends on the resistance voltage division circuit constituted by the resistors R15 to R19, if the voltage switching characteristic in the generation control circuit 13 is not steep, a circuit operation delay may occur. In this embodiment, since the intermediate differential switching instruction signal 12S is output to the generation control circuit 13 upon being converted into a low-impedance signal, even if the voltage switching characteristic of the generation control circuit 13 is not steep, no delay occurs in the externally input single-phase switching instruction signal 10S. This makes it possible to switch between the shutdown disable state and shutdown enable state in the output circuit 15.

An essential reason for the incorporation of the intermediate buffer 12 is to reduce the transition region of the single-phase switching instruction signal 10S in which the shutdown disable state and shutdown enable state switch each other. That is, the intermediate buffer 12 plays a role of switching between the shutdown disable state and shutdown enable state immediately when the single-phase switching instruction signal 10S reaches a given threshold with an increase in the gain from the input of the single-phase switching instruction signal 10S to the output of the control voltage VCS.

Therefore, impedance conversion as the function of the intermediate buffer 12 is not an essential element.

[Third Embodiment]

Figure 5:
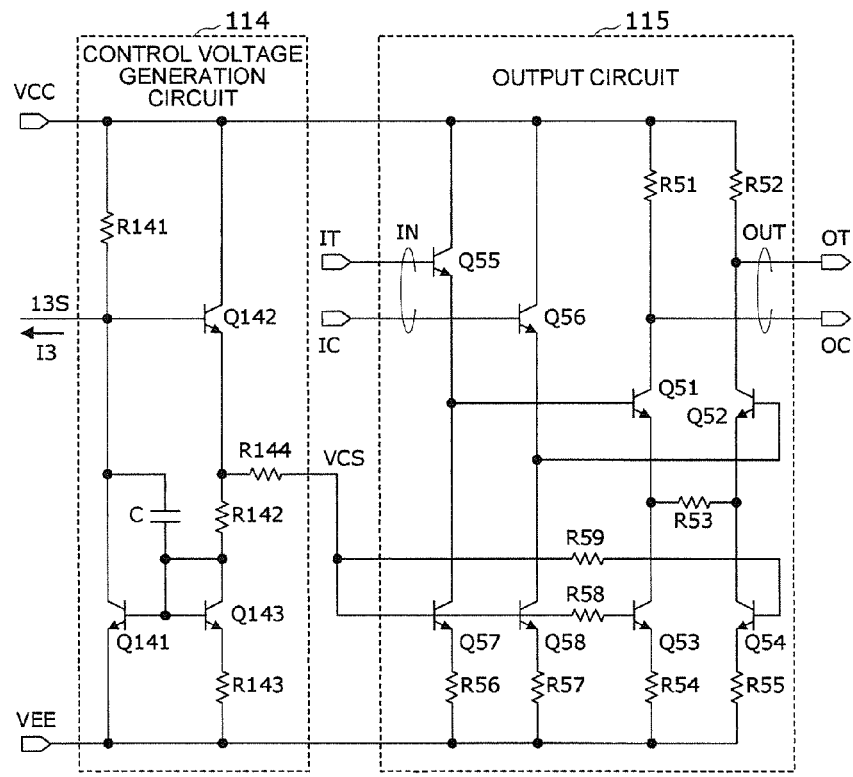
FIG. 5 is a circuit diagram showing the main part of a signal output circuit according to the third embodiment of the present invention.

A signal output circuit according to the third embodiment of the present invention will be described next with reference to FIG. 5. FIG. 5 shows the main part of the signal output circuit according to the third embodiment.

The first embodiment has exemplified the case in which the control voltage generation circuit 14 is formed from the constant voltage generation circuit and the emitter follower, and the output circuit 15 is formed from the differential amplifier.

The third embodiment will exemplify a case in which a control voltage generation circuit 114 includes an emitter-grounded amplification circuit and an emitter follower and forms a negative feedback circuit, an output circuit 115 is formed from an emitter follower and a differential amplifier, and both the emitter follower and the differential amplifier are set in the shutdown state at the shutdown enable time.

Note that arrangements other than these arrangements according this embodiment are the same as those in the first embodiment, and hence a detailed description of them will be omitted.

[Control Voltage Generation Circuit]

The arrangement and operation of the control voltage generation circuit 114 according to this embodiment will be described with reference to FIG. 5.

The control voltage generation circuit 114 includes an npn transistor Q141 (fourth npn transistor), a resistor R141 (second resistor or internal resistor), a capacitor C, an npn transistor Q142 (fifth npn transistor), an npn transistor Q143 (sixth npn transistor), and a resistor R144 (fifth resistor). The transistor Q141 has a collector terminal receiving a generation control signal 13S, and an emitter terminal connected to a power supply potential VEE. The resistor R141 has one port connected to the collector terminal of the transistor Q141, and the other port connected to a power supply potential VCC. The capacitor C has one port connected to the collector terminal of the transistor Q141, and the other port connected to the base terminal of the transistor Q141. The transistor Q142 has a base terminal receiving the generation control signal 13S, and a collector terminal connected to the power supply potential VCC. The transistor Q143 has base and collector terminals connected to the base terminal of the transistor Q141 and also connected to the emitter terminal of the transistor Q142 via a resistor R142 (third resistor), and an emitter terminal connected to the power supply potential VEE via a resistor R143 (fourth resistor). The resistor R144 has one port connected to the emitter terminal of the transistor Q142. The resistor R144 outputs the control voltage VCS from the other port.

In the control voltage generation circuit 114, the transistor Q141 and the resistor R141 constitute an emitter-grounded amplification circuit, and the transistors Q142 and Q143 and the resistors R142 and R143 constitute an emitter follower. An output from the emitter-grounded amplification circuit is input to the emitter follower, and an output from the emitter follower is input to the emitter-grounded amplification circuit, thereby forming a negative feedback circuit as a whole. The capacitor C is a stabilizing capacitor in the negative feedback circuit, which is added to the control voltage generation circuit 114 to stably implement negative feedback in the operating frequency band. The resistor R144 is added to the node of the output circuit 115 on the subsequent stage to make the control voltage generation circuit 114 apply the stable control voltage VCS without oscillation to the output circuit 115.

The control voltage generation circuit 114 digitally switches the voltage value of the control voltage VCS in accordance with an output current I3 of the generation control signal 13S output from a generation control circuit 13. As in the first embodiment, the output current I3 is digitally turned on (I3=Ion) and off (I3=0) by a voltage level VSHD of a terminal SHD to which a single-phase switching instruction signal 10S is input. When I3=Ion, the potential at the base terminal of the transistor Q142 decreases by R141×Ion as compared when I3=0. This embodiment is designed such that when the potential at the base terminal of the transistor Q142 decreases by R141×Ion, the control voltage VCS is set to a level close to the voltage VEE (0 V). According to this design, when I3=Ion, that is, the low-level single-phase switching instruction signal 10S is input, the control voltage VCS is set to a value close to 0 V.

In contrast, when I3=0, no current flows into the generation control circuit 13, and hence voltage VCS=Vo (Vo>0) determined by the negative feedback circuit constituted by the emitter-grounded amplification circuit and the emitter follower. With this operation, when I3=0, that is, the high-level single-phase switching instruction signal 10S is input, the control voltage VCS is set to the voltage Vo.

[Output Circuit]

The arrangement and operation of the output circuit 115 according to this embodiment will be described with reference to FIG. 5.

The output circuit 115 includes an npn transistor Q55 (13th npn transistor), an npn transistor Q56 (14th npn transistor), an npn transistor Q57 (15th npn transistor), and an npn transistor Q58 (16th npn transistor) in addition to the circuit arrangement in FIG. 2. The transistor Q55 has a base terminal receiving a positive-phase input signal, and a collector terminal connected to the power supply potential VCC. The transistor Q56 has a base terminal receiving an opposite-phase input signal, and a collector terminal connected to the power supply potential VCC. The transistor Q57 has a base terminal receiving the control voltage VCS, a collector terminal connected to the emitter terminal of the transistor Q55, and an emitter terminal connected to the power supply potential VEE via a resistor R56 (20th resistor). The transistor Q58 has a base terminal receiving the control voltage VCS, a collector terminal connected to the emitter terminal of the transistor Q56, and an emitter terminal connected to the power supply potential VEE via a resistor R57 (21st resistor). The base terminal of the transistor Q51 is connected to the emitter terminal of the transistor Q55. The base terminal of the transistor Q52 is connected to the emitter terminal of the transistor Q56. The control voltage VCS is input to the base terminal of the transistor Q53 via a resistor R58 (22nd resistor). The VCS is input to the base terminal of the transistor Q54 via a resistor R59 (23rd resistor). Note that the terminal IT is connected to the base terminal of the transistor Q55. For this reason, the base terminal of the transistor Q51 which is connected to the emitter terminal of the transistor Q55 is connected to the terminal IT via the transistor Q55. In addition, the terminal IC is connected to the base terminal of the transistor Q56. For this reason, the base terminal of the transistor Q52 which is connected to the emitter terminal of the transistor Q56 is connected to the terminal IC via the transistor Q56.

In the output circuit 115, the transistors Q51 to Q54 and the resistors R51 to R55 constitute the same differential amplifier as that in the first embodiment. In addition to this differential amplifier, the output circuit 115 according to this embodiment is provided with the emitter follower constituted by the transistors Q55 to Q58 and the resistors R56 and R57 and the resistors R58 and R59 which stably apply the control voltage VCS to the current source transistors Q53 and Q54 of the differential amplifier while suppressing oscillation.

The output circuit 115 digitally switches its state between the shutdown disable state and shutdown enable state in accordance with the control voltage VCS from the control voltage generation circuit 114. When VCS=0 V, that is, the low-level single-phase switching instruction signal 10S is input, the base-emitter voltages of the transistors Q53 and Q54 as the current source transistors of the differential amplifier and of the transistors Q57 and Q58 as the current source transistors of the emitter follower become almost 0 V. For this reason, no collector current flows in the transistors Q53, Q54, Q57, and Q58, and no current flows in the transistors Q51 and Q52 constituting an emitter-coupled pair in the differential amplifier and the switching transistors Q55 and Q56 of the emitter follower. As a consequence, the differential input signals IN are not set in the shutdown disable state and are set in the shutdown state.

In this case, this shutdown enable operation is performed in not only the differential amplifier but also the emitter follower on the preceding stage. This enhances the shutdown enable effect. In general, in a shutdown enable state, signals leak via parasitic capacitances between the bases and emitters of transistors or the bases and collectors of transistors. However, since the two circuits, namely the emitter follower and the differential amplifier, are both set in the shutdown enable state, the parasitic capacitances of the transistors Q55 and Q56 and the transistors Q51 and Q52 are connected in series. This reduces the coupled capacitance. The smaller the parasitic capacitances, the smaller the leakage signals. This embodiment therefore sufficiently reduces the differential output signals OUT leaking to the terminals OT and OC as compared with the first embodiment.

In contrast, when VCS=Vo, that is, the high-level single-phase switching instruction signal 10S is input, the current source transistors Q53, Q54, Q57, and Q58 supply sufficient currents to the emitter-coupled paired transistors Q51 and Q52 and the switching transistors Q55 and Q56 to perform shutdown disable operation. This makes the transistors Q55, Q56, Q51, and Q52 perform shutdown disable operation with respect to the differential input signals IN and output them to the output terminals OT and OC.

FIGS. 6A to 6D show the simulation waveforms of differential output signals in the shutdown enable state. FIGS. 7A to 7D show the simulation waveforms of differential output signals in the shutdown disable state. In these simulations, the differential input signals IN formed from 410-mVpp, 32-Gbps pseudo random signals were applied to the output circuit 115.

FIG. 6A shows the waveform of a positive-phase output signal, of the differential output signals OUT, which is output from the terminal OT when the voltage VSHD of the single-phase switching instruction signal 10S is 0 V. The amplitude of the positive-phase output signal at this time was 13 mVpp.

FIG. 6B shows the waveform of an opposite-phase output signal, of the differential output signals OUT, which is output from the terminal OC under the same condition as that in FIG. 6A. The amplitude of the opposite-phase output signal at this time was 14 mVpp.

FIG. 6C shows the waveform of a positive-phase output signal of the differential output signals OUT when the voltage VSHD is 0.8 V. The amplitude of the positive-phase output signal at this time was 18 mVpp.

FIG. 6D shows the waveform of an opposite-phase output signal of the differential output signals OUT under the same condition as that in FIG. 6C. The amplitude of the opposite-phase output signal at this time was 17 mVpp.

As is obvious from FIGS. 6A to 6D, when the low LVTTL level voltage VSHD is 0 V and 0.8 V, the amplitudes of the respective phase signals of the differential output signals OUT are 18 mVpp at maximum. That is, a good shutdown enable state is set.

Figure 7A:
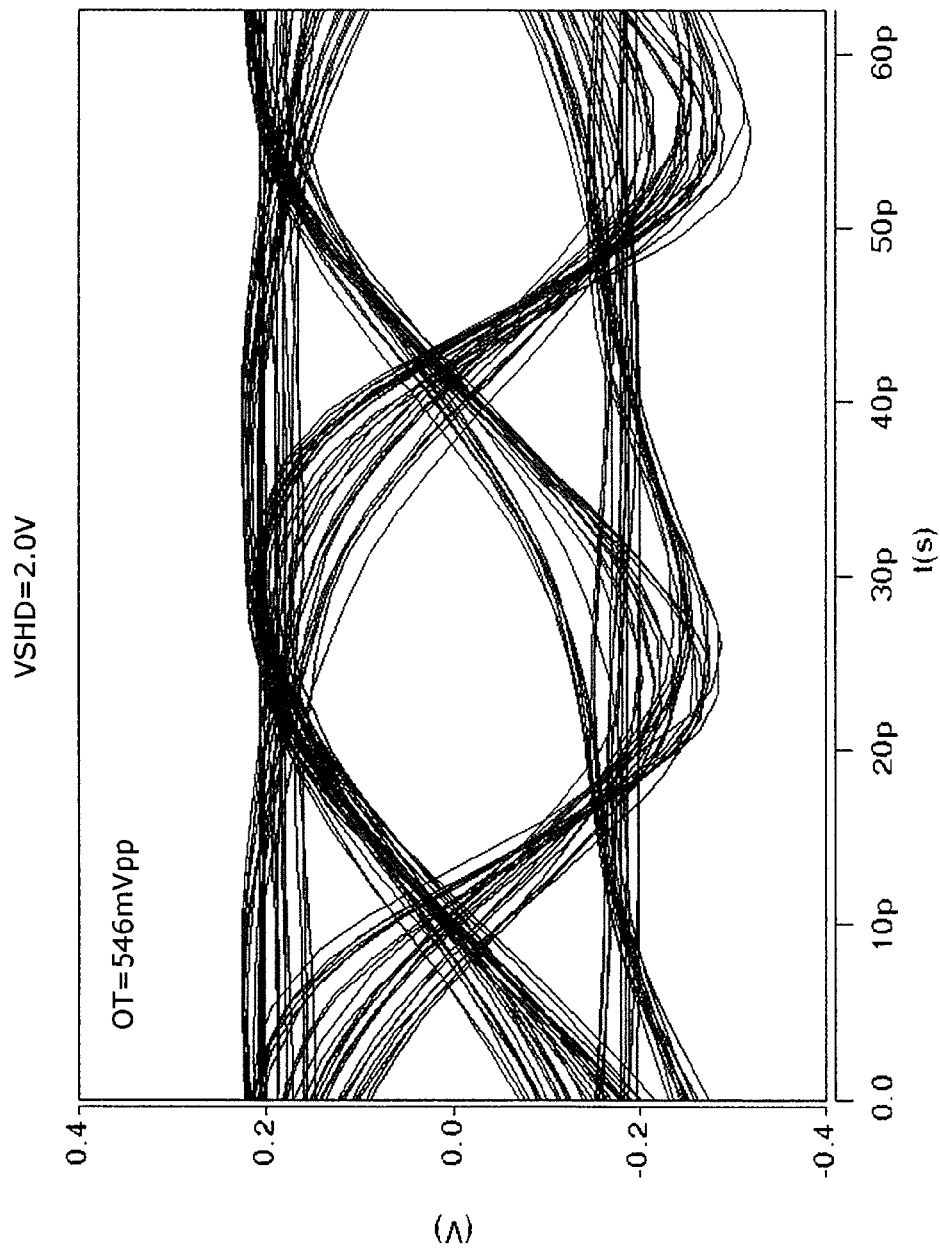

FIG. 7A shows the waveform of a positive-phase output signal, of the differential output signals OUT, which is output from the terminal OT when the voltage VSHD of the single-phase switching instruction signal 10S is 2.0 V. The amplitude of the positive-phase output signal at this time was 546 mVpp.

FIG. 7B shows the waveform of an opposite-phase output signal, of the differential output signals OUT, which is output from the terminal OC under the same condition as that in FIG. 7A. The amplitude of the opposite-phase output signal at this time was 536 mVpp.

Figure 7C:
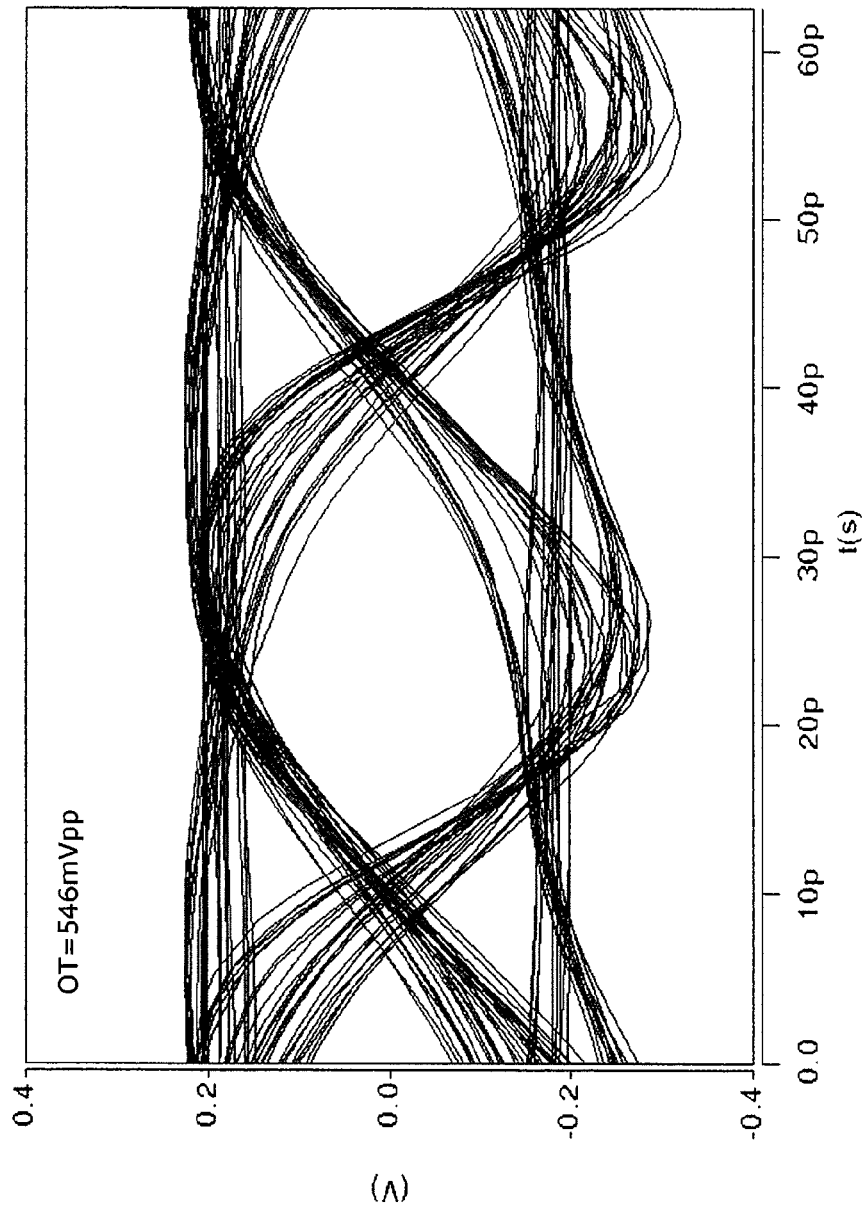

FIG. 7C shows the waveform of a positive-phase output signal of the differential output signals OUT when the voltage VSHD is 3.3 V. The amplitude of the positive-phase output signal at this time was 546 mVpp.

Figure 7D:
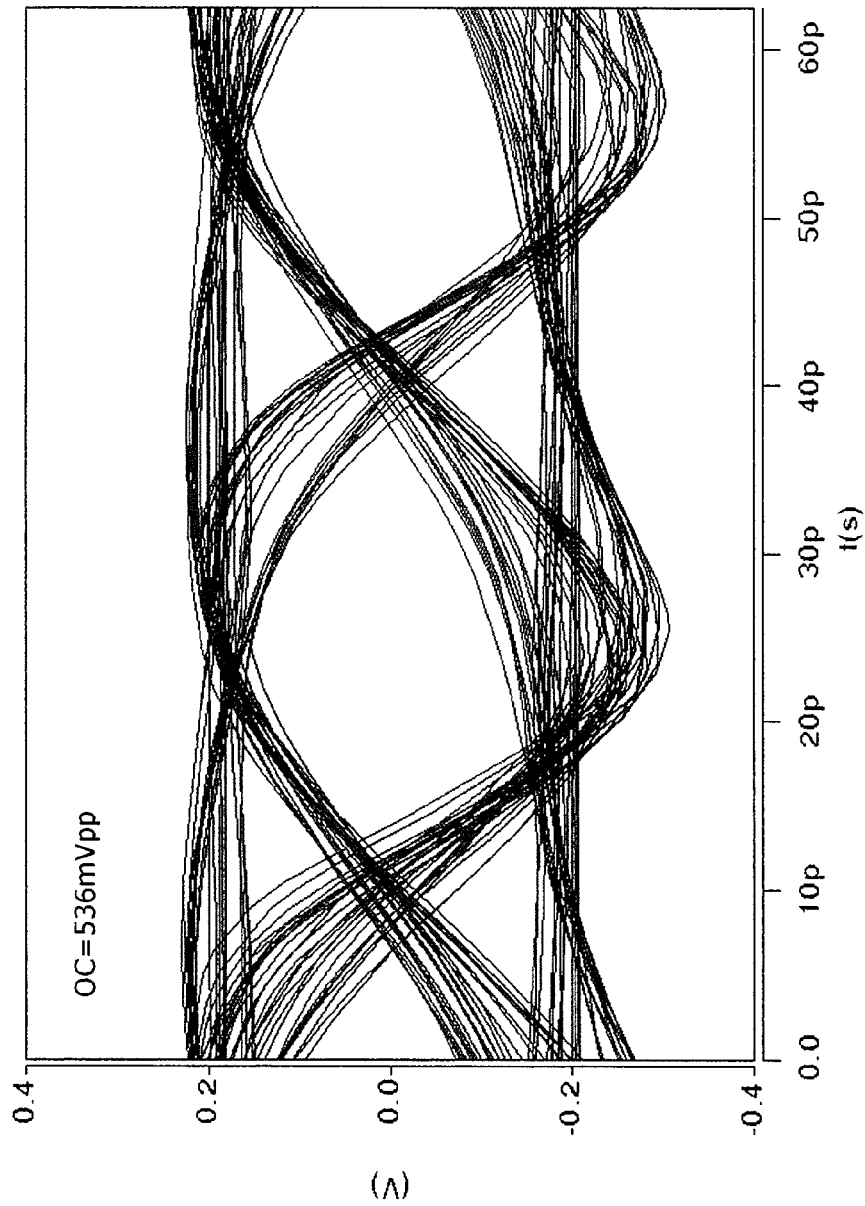

FIG. 7D shows the waveform of an opposite-phase output signal of the differential output signals OUT under the same condition as that in FIG. 7C. The amplitude of the opposite-phase output signal at this time was 536 mVpp.

As is obvious from FIGS. 7A to 7D, when the high LVTTL level voltage VSHD is 2.0 V and 3.3 V, the amplitudes of the respective phase signals of the differential output signals OUT are 536 mVpp at minimum. That is, a good shutdown disable state is set.

Obviously, the single-phase switching instruction signal 10S applied to the terminal SHD switches between the shutdown enable state and shutdown disable state of the differential output signals OUT.

[Effects of Third Embodiment]

As described above, in this embodiment, the control voltage generation circuit 114 includes the emitter-grounded amplification circuit and the emitter follower and forms a negative feedback circuit as a whole. In addition, the control voltage generation circuit 114 is designed to output the control voltage VCS via the resistor R144. This can make the control voltage generation circuit 114 stably operate, thus stably applying the control voltage VCS to the output circuit 115.

In addition, in this embodiment, the output circuit 115 is constituted by the emitter follower and the differential amplifier, and both the emitter follower and the differential amplifier are set in the shutdown state at the shutdown enable time. This can sufficiently reduce the differential output signals OUT leaking to the terminals OT and OC when the low-level single-phase switching instruction signal 10S is input, as compared with the first embodiment.

Furthermore, the control voltage generation circuit 114 applies the control voltage VCS to the base terminals of the current source transistors Q53 and Q54 of the differential amplifier via the resistors R58 and R59. This makes it possible to stably apply the control voltage VCS while suppressing oscillation.

Note that it is possible to obtain the same effects as those described above by implementing the control voltage generation circuit 114 and the output circuit 115 in this embodiment in combination or separately.

[Extension of Embodiments]

Although the present invention has been described with reference to the embodiments, the present invention is not limited to the above embodiments. Various modifications which can be understood by those skilled in the art can be made in the arrangements and details of the present invention within the scope of the present invention. In addition, the respective embodiments can be arbitrarily combined and executed within a consistent range.

In addition, this specification uses the expressions "base terminal", "emitter terminal", and "collector terminal" of a transistor. However, each terminal need not have an electrode terminal or the like. It is therefore possible to read "base terminal", "emitter terminal", and "collector terminal" as "base", "emitter", and "collector", respectively.

What is claimed is:

1. A signal output circuit comprising:
an input buffer, a generation control circuit, a control voltage generation circuit, and an output circuit, each using npn transistors,
wherein the input buffer externally receives a single-phase switching instruction signal for instructing to switch a state of the output circuit to one of a shutdown disable state and a shutdown enable state, and converts and outputs the single-phase switching instruction signal into a differential switching instruction signal formed from two signals having phases opposite to each other,
the generation control circuit outputs a generation control signal for controlling generation of a control voltage in the control voltage generation circuit based on the differential switching instruction signal,
the control voltage generation circuit outputs the control voltage upon changing a value of the control voltage in accordance with a logic of the single-phase switching instruction signal based on the generation control signal, and
the output circuit externally receives a differential input signal, outputs a differential output signal upon impedance-converting the differential input signal, and switches between the shutdown disable state and the shutdown enable state of the differential input signal based on the control voltage,
wherein the generation control circuit comprises
a first npn transistor having a collector and base connected to a first power supply potential on a high-potential side,
a second npn transistor having a base receiving a signal, of the differential switching instruction signals, which is in phase with the single-phase switching instruction signal, a collector connected to an emitter of the first npn transistor, and an emitter connected to a second power supply potential on a low-potential side via a first resistor, and
a third npn transistor having a base receiving a signal, of the differential switching instruction signals, which is opposite in phase to the single-phase switching instruction signal, an emitter connected to an emitter of the second npn transistor, and a collector from which the generation control signal is output.

2. A circuit according to claim 1, wherein the control voltage generation circuit comprises
a fourth npn transistor having a base and collector receiving the generation control signal, with the base and collector being connected to the first power supply potential on the high-potential side via a second resistor;
a fifth npn transistor having a base and collector connected to an emitter of the fourth npn transistor, and an emitter connected to the second power supply potential on the low-potential side via a third resistor,
a sixth npn transistor having a base and collector connected to the first power supply potential, and
a seventh npn transistor having a base receiving the generation control signal, a collector connected to an emitter of the sixth npn transistor, and an emitter connected to the second power supply potential via a fourth resistor, with the control voltage being output from the emitter.

3. A circuit according to claim 1, wherein the control voltage generation circuit comprises a fourth npn transistor having a collector receiving the generation control signal, and an emitter connected to the second power supply potential on the low-potential side,
a second resistor having one port connected to the collector of the fourth npn transistor, and the other port connected to the first power supply potential on the high-potential side,
a capacitor having one port connected to the collector of the fourth npn transistor, and the other port connected to a base of the fourth npn transistor,
a fifth npn transistor having a base receiving the generation control signal, and a collector connected to the first power supply potential,
a sixth npn transistor having a base and collector connected to the base of the fourth npn transistor and connected to an emitter of the fifth npn transistor via a third resistor, and an emitter connected to the second power supply potential via a fourth resistor, and
a fifth resistor having one port connected to an emitter of the fifth npn transistor, and the other port from which the control voltage is output.

4. A circuit according to claim 1, wherein the input buffer comprises
a sixth resistor having one port connected to an instruction input terminal receiving the single-phase switching instruction signal, and the other port connected to the first power supply potential on the high-potential side,
an eighth npn transistor having a base connected to the instruction input terminal via a seventh resistor, an emitter connected to the second power supply potential on the low-potential side via an eighth resistor, and a collector from which a signal, of the differential switching instruction signals, which is opposite in phase to the single-phase switching instruction signal is output,
a ninth resistor having one port connected to the base of the eighth npn transistor, and the other port connected to the second power supply potential,
a 11th resistor having one port connected to the collector of the eighth npn transistor, and the other port connected to the first power supply potential via a 10th resistor,
a 12th resistor having one port connected to the collector of the eighth npn transistor, and the other port connected to the second power supply potential,
a 13th resistor having one port connected to a connection node of the 10th resistor and the 11th resistor, and
a 14th resistor having one port connected to the second power supply potential, and the other port connected to the other port of the 13th resistor, with a signal, of the differential switching instruction signals, which is in phase with the single-phase switching instruction signal being output from the other port.

5. A circuit according to claim 1, wherein the output circuit comprises
a ninth npn transistor having a base connected to a first differential input terminal to which a first phase input signal of the differential input signals is input, and a collector connected to the first power supply potential on the high-potential side via a 15th resistor, with a second phase output signal of the differential output signals being output from the collector,
a 10th npn transistor having a base connected to a second differential input terminal to which a second phase input signal of the differential input signals is input, and a collector connected to the first power supply potential via a 16th resistor, with a first phase output signal of the differential output signals being output from the collector, a 17th resistor having one port connected to an emitter of the ninth npn transistor, and the other port connected to an emitter of the 10th npn transistor, a 11th npn transistor having a base receiving the control voltage, a collector connected to the emitter of the ninth npn transistor, and an emitter connected to the second power supply potential on the low-potential side via an 18th resistor, and a 12th npn transistor having a base receiving the control voltage, a collector connected to the emitter of the 10th npn transistor, and an emitter connected to the second power supply potential via a 19th resistor.

6. A circuit according to claim 5, wherein the output circuit comprises a 13th npn transistor having a base connected to the first differential input terminal, and a collector connected to the first power supply potential, a 14th npn transistor having a base connected to the second differential input terminal, and a collector connected to the first power supply potential, a 15th npn transistor having a base receiving the control voltage, a collector connected to an emitter of the 13th npn transistor, and an emitter connected to the second power supply potential via a 20th resistor, and a 16th npn transistor having a base receiving the control voltage, a collector connected to an emitter of the 14th npn transistor, and an emitter connected to the second power supply potential via a 21st resistor, the base of the ninth npn transistor is connected to an emitter of the 13th npn transistor to be connected to the first differential input terminal via the 13th npn transistor, the base of the 10th npn transistor is connected to the emitter of the 14th npn transistor to be connected to the second differential input terminal via the 14th npn transistor, the control voltage is input to the base of the 11th npn transistor via a 22nd resistor, and the control voltage is input to the base of the 12th npn transistor via a 23rd resistor.

7. A circuit according to claim 1, further comprising an intermediate buffer using an npn transistor, which is inserted between the input buffer and the generation control circuit and outputs, to the generation control circuit, the differential switching instruction signal output from the input buffer as an intermediate differential switching instruction signal, wherein the generation control circuit outputs the generation control signal based on the intermediate differential switching instruction signal.

8. A circuit according to claim 7, wherein the intermediate buffer comprises a 17th npn transistor having a base and collector connected to the first power supply potential on the high-potential side, an 18th npn transistor having a base receiving a signal, of the differential switching instruction signals, which is in phase with the single-phase switching instruction signal, and a collector connected to an emitter of the 17th npn transistor via a 24th resistor, a 19th npn transistor having a base receiving a signal, of the differential switching instruction signals, which is opposite in phase to the single-phase switching instruction signal, and a collector connected to the emitter of the 17th npn transistor via a 25th resistor, a 20th npn transistor having a base to which a bias constant voltage is applied, a collector connected to an emitter of the 18th npn transistor and an emitter of the 19th npn transistor, and an emitter connected to the second power supply potential on the low-potential side via a 26th resistor, a 21st npn transistor having a base connected to the collector of the 19th npn transistor, a collector connected to the first power supply potential, and an emitter from which a signal, of the intermediate differential switching instruction signals, which is in phase with the single-phase switching instruction signal is output, a 22nd npn transistor having a base connected to the collector of the 18th npn transistor, a collector connected to the first power supply potential, and an emitter from which a signal, of the intermediate differential switching instruction signals, which is opposite in phase to the single-phase switching instruction signal is output, a 23rd npn transistor having a base to which the bias constant voltage is applied, a collector connected to the emitter of the 21st npn transistor, and an emitter connected to the second power supply potential via a 27th resistor, and a 24th npn transistor having a base to which the bias constant voltage is applied, a collector connected to the emitter of the 22nd npn transistor, and an emitter connected to the second power supply potential via a 28th resistor.

9. A circuit according to claim 1, wherein the control voltage generation circuit changes the control voltage in accordance with a voltage generated at an internal resistor, and the generation control circuit changes a voltage generated at the internal resistor by extracting a current from the control voltage generation circuit via the internal resistor and changing a current flowing in the internal resistor based on the differential switching instruction signal.

* * * * *